United States Patent
Loh et al.

(10) Patent No.: US 8,793,547 B2
(45) Date of Patent: Jul. 29, 2014

(54) 3D BUILT-IN SELF-TEST SCHEME FOR 3D ASSEMBLY DEFECT DETECTION

(71) Applicant: Altera Corporation, San Jose, CA (US)

(72) Inventors: Siang Poh Loh, Kedah (MY); Chooi Pei Lim, Penang (MY)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 13/733,071

(22) Filed: Jan. 2, 2013

(65) Prior Publication Data
US 2014/0189456 A1    Jul. 3, 2014

(51) Int. Cl.
| | | |
|---|---|---|
| G01R 31/28 | (2006.01) | |
| G01R 31/3177 | (2006.01) | |
| H01L 25/065 | (2006.01) | |
| G01R 31/3185 | (2006.01) | |
| G01R 31/3187 | (2006.01) | |

(52) U.S. Cl.
CPC ........ *G01R 31/3177* (2013.01); *G01R 31/2812* (2013.01); *H01L 25/0657* (2013.01); *G01R 31/318513* (2013.01); *G01R 31/3187* (2013.01)
USPC ............. 714/733; 714/25; 714/715; 714/719; 714/726; 714/727; 714/729; 714/734

(58) Field of Classification Search
CPC ........... G01R 31/3187; G01R 31/2801; G01R 31/318513; G01R 31/31717; H01L 25/0657; H01L 2225/06503; H01L 2924/0002; H01L 2225/1047; H01L 2924/00
USPC ........... 714/25, 715, 719, 726, 727, 729, 733, 714/734
See application file for complete search history.

(56) References Cited

U.S. PATENT DOCUMENTS

| | | | | |
|---|---|---|---|---|
| 5,670,883 | A  * | 9/1997 | O'Donoghue et al. | 324/537 |
| 8,242,589 | B2 * | 8/2012 | Saen et al. | 257/686 |
| 2003/0103462 | A1* | 6/2003 | Smith | 370/241 |
| 2007/0022333 | A1* | 1/2007 | Terry | 714/718 |
| 2007/0210306 | A1* | 9/2007 | Molinelli Acocella et al. | 257/48 |
| 2011/0156717 | A1* | 6/2011 | Tsai et al. | 324/538 |
| 2012/0138927 | A1* | 6/2012 | Kang | 257/48 |

* cited by examiner

*Primary Examiner* — John Trimmings
(74) *Attorney, Agent, or Firm* — Weaver Austin Villeneuve & Sampson LLP

(57) ABSTRACT

Techniques and mechanisms are provided for an improved built in self-test (BIST) mechanism for 3D assembly defect detection. According to an embodiment of the present disclosure, the described mechanisms and techniques can function to detect defects in interconnects which vertically connect different layers of a 3D device, as well as to detect defects on a 2D layer of a 3D integrated circuit. Additionally, according to an embodiment of the present disclosure, techniques and mechanisms are provided for determining not only the presence of a defect in a given set of interfaces of an integrated circuit, but the particular interface at which a defect may exist.

17 Claims, 14 Drawing Sheets

3D BUILT-IN SELF-TEST SCHEME FOR 3D ASSEMBLY DEFECT DETECTION

FIELD OF THE INVENTION

The present disclosure relates generally to integrated circuit manufacturing, and, more particularly, to techniques and mechanisms for improved testing techniques and/or Design for Testing (DFT) solutions for integrated circuits.

BACKGROUND

As integrated circuits (ICs) have become increasingly miniaturized and complex, manufacturing challenges have arisen. Such challenges for example include barriers to interconnect scaling. 3D integrated circuits have been proposed as one solution to overcome such challenges. By utilizing fast and densely packed inter-die vias, 3D ICs can provide the possibility for continued high performance using CMOS technology, for example.

Developing 3D ICs, however, presents its own set of unique challenges. Among other things, a critical feature of any semiconductor device fabrication process is testing. In conventional integrated circuit manufacturing processes, for example, after a wafer is processed, the wafers are probed using an external probing device. Through this process, individual dies on the wafers are tested for functionality before the dies are separated and individually packaged. This process is often referred to as "wafer sort". Testing may also be performed at a "final test" (FT) phase to insure that a final packaged IC functions properly. Final test in the context of 3D integrated circuit manufacture generally refers to a final product test that occurs after 3D assembly of the different die layers into one device or product.

As IC devices have become smaller, testing has also become more complex and challenging. Increasingly, it has become necessary to design an IC chip for testing ahead of time. Testing techniques and design for testing (DFT) solutions are fairly well established in the context of 2D devices, but have not yet been developed as robustly in the context of 3D devices. 3D integrated circuits present some unique challenges to testing. These testing challenges can relate, among other things, to more difficult probe access to wafers, difficulty of test access to modules in stacked wafers and dies, thermal concerns, challenges to testability of certain designs, cost of testing solutions, and new defects that can potentially arise from processing steps unique to 3D ICs such as wafer thinning, alignment and bonding. The processing steps unique to 3D integrated circuit can necessitate additional testing processes: for example, a first step to insure that a device is working properly on each of its 2D levels (for example, a pre-bond wafer/die test), and a second step (for example, a post-bond wafer/die test) to insure that the device is properly functioning in terms of its vertical connections.

Testing solutions have sometimes not kept pace with advances in architectures, design automation tools, and yield enhancement techniques. Cost of testing and the consequences of design decisions on testing can often be unanticipated handicaps to developing efficient processes for manufacturing 3D integrated circuits.

Various embodiments of the present disclosure seek to improve upon testing techniques and Design For Testing (DFT) solutions for testing 3D ICs, as well as 2D ICs.

BRIEF DESCRIPTION OF THE DRAWINGS

Techniques and mechanisms are provided for improving testing techniques and DFT solutions for testing 3D ICs, as well as 2D ICs.

The above techniques and mechanisms, together with other features, embodiments, and advantages of the present disclosure, may best be understood by reference to the following description taken in conjunction with the accompanying drawings, which illustrate various embodiments of the present techniques and mechanisms. In the drawings, structural elements having the same or similar functions are denoted by like reference numerals.

DESCRIPTION OF PARTICULAR EMBODIMENTS

Overview

Figure 1:
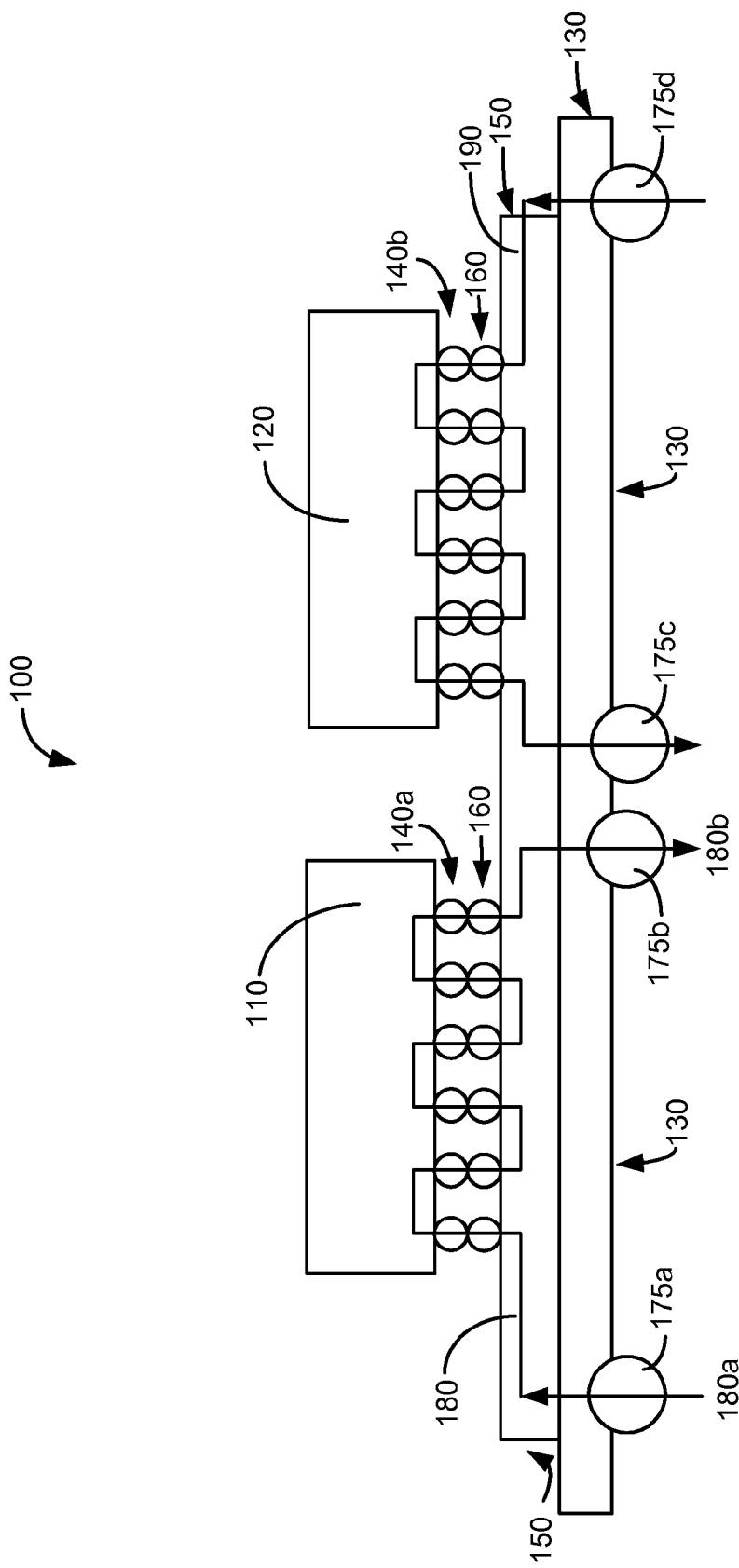
FIG. 1 is a simplified block diagram of a side-by-side or multiple chip module.

Techniques and mechanisms for improving testing techniques and DFT solutions for testing 3D ICs, as well as 2D ICs, are described.

According to an embodiment of the present disclosure, a method for determining the existence of defects in a semiconductor device by using a 3D-Assembly Built in Self-Test (BIST) structure comprising at least one TX BIST and RX BIST pair is provided. The method may involve a first TX BIST launching a first test pattern at a first test clock cycle. After the first test pattern has passed through a portion of the semiconductor device being tested for defects, the first test pattern is captured at a first RX BIST. The portion of the device being tested for defects might comprise a z direction 3D interface, or it might comprise a portion of a semiconductor die layer in the x-y plane. Next, the first RX BIST stores the first test pattern at a first memory location. The first TX BIST launches a second test pattern at a second test clock cycle. The first RX BIST captures the second test pattern after the test pattern has passed through the portion of the semiconductor device being tested for defects. The first RX BIST stores the second test pattern at a second memory location. The first RX BIST analyzes values stored in the first and second capture registers to determine whether a defect might exist in the semiconductor device.

The foregoing, together with other features, embodiments, and advantages of the present disclosure, will become more apparent when referring to the following specification, claims, and accompanying drawings.

Example Embodiments

There are various 3D IC manufacturing processes. Some techniques can involve creating multiple device layers on a same wafer in a serial manner. These techniques are frequently referred to as monolithic 3D techniques. In other 3D integration techniques, separate 2D die layers, each manufactured using conventional 2D processes, can be stacked vertically to form a 3D IC.

Each interconnect in such 3D ICs may have a pre-defined path whether horizontally in the x-y plane or vertically in the z-direction up or down. Z-direction generally refers to die to die interfaces.

Both the monolithic and die stacking techniques introduce the possibility of defective interconnects. For example, in die stacking, bonding together the separate layers usually requires precise alignment of interdie vias and the use of thermocompression, and small errors in either of these processes can introduce defects into the interconnects.

Accordingly, generally, in 3D integration, as the die-to-die interconnect count increases, the assembly yield for the 3D IC decreases. Die-to-die interconnect counts for 3D stacked die ICs can range from a 1000 to tens of 1000 s. Based on sample test chip data, a μ-bump chain with 250+μ-bumps sometimes only has approximately a 60% yield.

In order to address this negative impact on 3D device yields, various schemes have been developed to address defective interconnects. Certain architectures can use redundant interconnects (what are often referred to as redundant bumps) in order to maximize assembly yields. In such solution, where an interconnect is found to be defective, the redundant (back up) interconnect can be brought into operation.

Z-direction redundancy schemes exist which can be implemented into a 3D interface to correct deficiencies in particular interface bumps. However, even assuming an implementation of a redundant bump architecture (or other solution for defective interconnects) were in place, an effective scheme for detecting defective bumps is crucial, because identifying locations of defects is needed to enable the redundant bump or other defect connection solution to work.

Various embodiments of the present disclosure provide improved schemes for defect detection in 3D and 2D integrated circuits. Various embodiments of the present disclosure provide a built-in self-test (BIST) mechanism for 3D assembly defect detection, as well as 2D defect detection. The embodiments of the present disclosure described below are discussed in terms of techniques relating to testing 3D ICs in the course of manufacture and packaging. It should however be understood that, in addition to such devices, the teachings of the present application may also be used in connection with the manufacture of 2D ICs. The embodiments of the present invention described below are not meant to limit the scope of the present invention.

It will be understood that various specific features of the described implementation may be varied without departing from the spirit of the present invention. Moreover, it will be understood that various features of different implementations described in this disclosure may be combined in another embodiment.

FIG. 1 is a simplified block diagram of a side-by-side or multiple chip module 100 which provides an example of a device that could be tested using an embodiment of the present disclosure. The module 100 comprises two semiconductor dies 110 and 120 located on a substrate 130. The semiconductor dies (Die__1 110 and Die__2 120) have associated microbump arrays 140a and 140b, respectively. Microbump arrays 140a and 140b are used to connect the semiconductor dies to a silicon interposer layer 150 through the silicon interposer layer's associated microbump array 160. Signals are transmitted from the semiconductor dies 110 and 120 through the microbump arrays 140a and 140b, respectively, then through microbump array 160 to the silicon interposer layer 150. Wired paths through the silicon interposer layer 150 and the substrate 130 are then used to transmit the signals to solder balls 175a, 175b 175c and 175d attached to the surface of the semiconductor device, which may be used to transmit signals to external devices or systems such as a printed circuit board (PCB).

A conventional technique used for testing interconnect defects, and performing fault diagnosis, is to use scan chains. Existing 3D assembly FT processes often engage multiple scan chains to test for 3D interconnect failures. Module 100 is one example of a device that may require testing and that may use multiple scan-chains to test for interconnect failure.

As shown in FIG. 1, two scan chains 180 and 190 are used to check the effectiveness of the interface interconnects between the interposer layer 150 and semiconductor dies 110 and 120. Each scan chain traverses a microbump interface used for communicating with one of the dies. In one conventional testing scheme, a test signal in input into a scan chain at an input point, for example, 180a, and output at the end of the scan chain at an output point, for example, 180b. The signal received at the output point is evaluated to see whether it is the same signal as the signal which was transmitted originally into the input point of the scan chain.

While scan chains are useful, they have limitations as testing techniques. Among other things, they are unable to identify the specific location of a defect caused by a 3D assembly process, for example, the particular micro-bump in an interface between two die layers which is defective. Further, a scan chain process is unable to determine whether an interconnect failure is due to a defect within one of the dies itself (that is, an x-y plane defect within a top or bottom die layer), or a defect due to a z direction interface failure between two different die layers. Causes for such failures can vary too. An x-y plane defect can be due to a x-y interface failure, or a driver failure, or other silicon failure on the x-y plane, for example.

Figure 2:
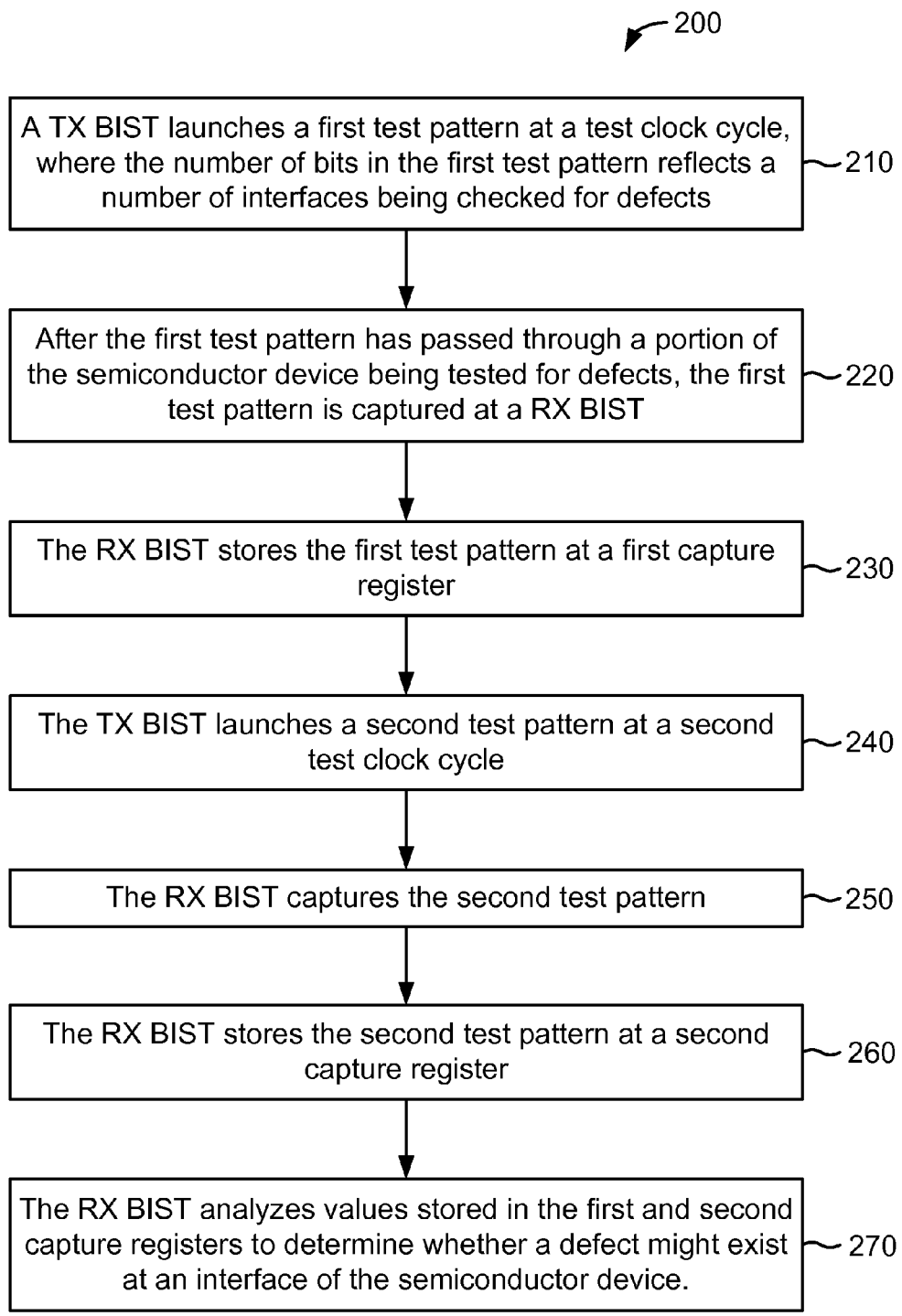
FIG. 2 is a simplified high-level flowchart depicting different features of an example method according to an embodiment of the present disclosure.

FIG. 2 is a simplified high-level flowchart depicting different features of an example method according to an embodiment of the present disclosure. FIG. 2 shows a method for determining the existence of defects in a semiconductor device by using a 3D-Assembly BIST structure comprising at least one TX BIST and RX BIST pair.

In 210, a first test pattern is launched at the TX BIST at a first test clock cycle, where, for example, the number of bits in the first test pattern reflects a number of interfaces being checked for defects. Each of a plurality of interfaces of a subject device desired to be tested receives one of the bits of the first test pattern from the TX BIST.

At 220, after the test pattern has passed through a portion of the semiconductor device desired to be tested for defects, the first test pattern is captured at an RX BIST. The portion of the device being tested for defects might comprise a z direction 3D interface, or it might comprise an x-y plane portion of a die layer At 230, the RX BIST stores the first test pattern at a first capture register.

At 240, the TX BIST launches a second test pattern at a second test clock cycle.

At 250, the RX BIST captures the second test pattern.

At 260, the RX BIST stores the second test pattern at a second capture register.

At 270, the RX BIST analyzes values stored in the first and second capture registers to determine whether a defect might exist at an interface of the semiconductor device.

Figure 3:
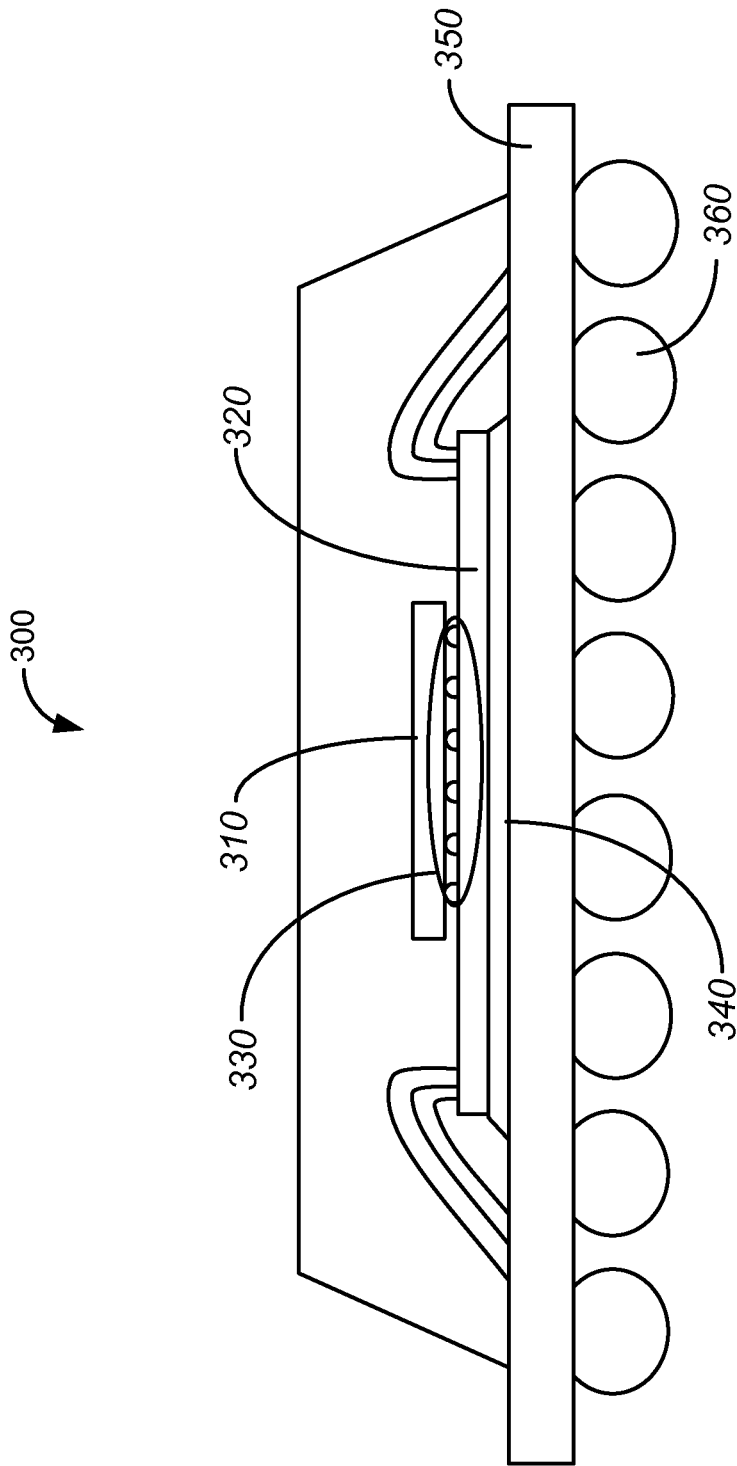
FIG. 3 is a simplified block diagram of a 3D integrated circuit.

FIG. 3 is a simplified block diagram of a vertical stacked die 300 which could be tested using an embodiment of the present disclosure.

The vertical stacked die 300 comprises two semiconductor dies 310 and 320 stacked on top of one another which are connected to one another by a micro-bump array 330. (In alternative embodiments, the semiconductor dies 310 and 320 may each have their own associated micro-bump arrays in the manner depicted in FIG. 1 by arrays 130 and 140, and the respective arrays may be connected to form the electrical connection.) In FIG. 3, the bottom die (semiconductor die 320) sits on top of an epoxy layer 340, which in turn sits on top of a substrate layer 350. Solder balls 360 attached to the surface of the substrate layer 350, may be used to transmit signals from the semiconductor device to external devices or systems such as a printed circuit board (PCB).

According to an embodiment of the present disclosure, the above 3D built-in self-test (BIST) process can be implemented either in hardware or in software.

Whether implemented in hardware or software, in various embodiments, the 3D BIST architecture may consist of two components: a TX BIST component for launching predefined test patterns, and an RX BIST component for capturing the test patterns, processing them to determine whether a defect exists, and reporting the test results.

Figure 4:
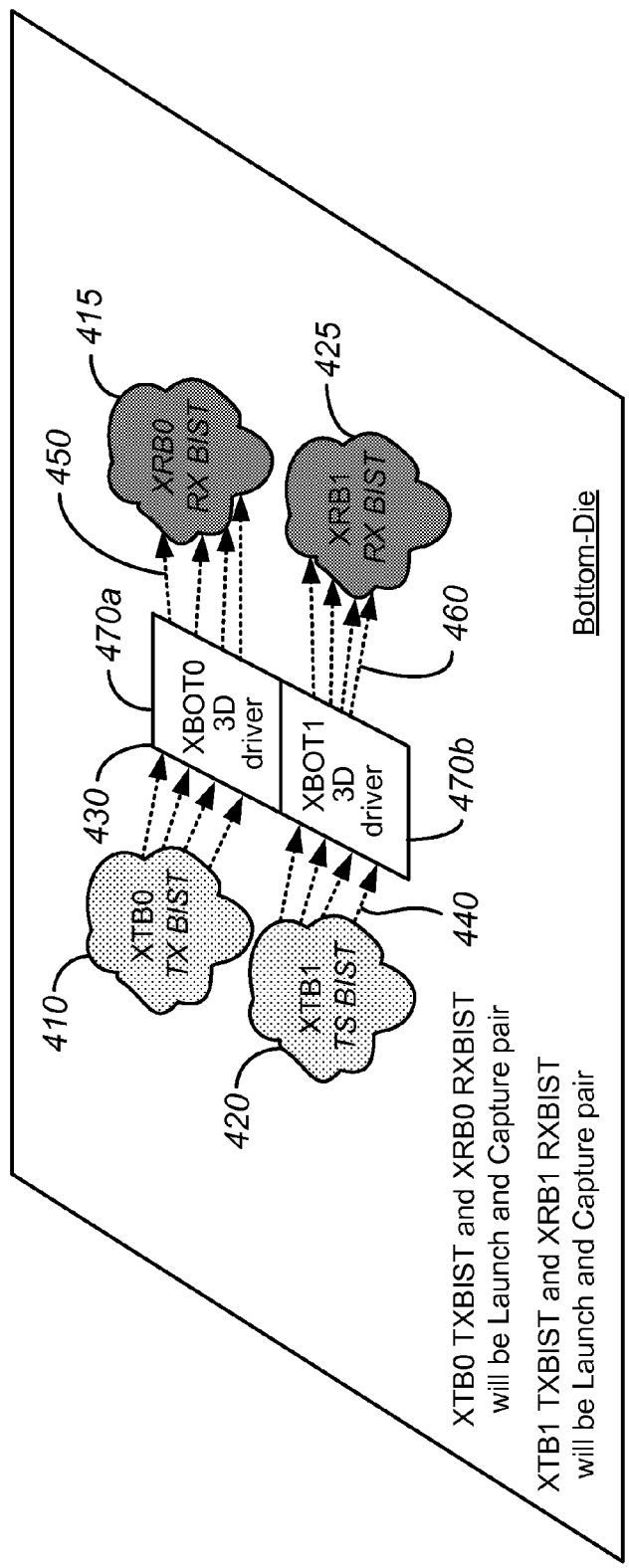
FIG. 4 is a simplified block diagram of a 3D built-in self-test scheme according to an embodiment of the present disclosure.

FIG. 4 depicts an example of a 3D BIST architecture according to an embodiment of the present disclosure. TX BIST and RX BIST components 410 and 415 may work together as part of a launch and capture pair. The TX BIST 410 component may generate two or more pre-defined test patterns and transmit them into the subject device 470a (that is, the device a user wishes to test). As an example, a first test pattern may be

10101010 and a second test pattern may be

01010101

While in the embodiments described in this disclosure only two test patterns are used, it will be understood that, in other embodiments, more test patterns may be used. As noted above, the test patterns may have the same number of bits, and the number of bits may correspond to a number of input interfaces of a subject device. For example, as shown in FIG. 4, the subject device 470a may have a set of four interfaces on the side adjacent to the TX BIST 410 for which defect detecting testing is desired. A test pattern having four bits is therefore used. In the depicted embodiment, a different bit of the test pattern is fed into each of the four different interfaces of the subject device 470a. These bits then traverse the subject device 470a and are output at another set of four interfaces 450, these interfaces being adjacent to the RX BIST module 415.

In FIG. 4, TX BISTS 410 and 420 are being used to test the input interfaces 430 and 440 and the output interfaces 450 and 460 of the subject devices 470a and 470b. Each of the TX BISTS launch two test patterns—"0101" and "1010"—into the input interfaces 430 and 440, respectively, being tested by that TX BIST.

RX BIST components 415 and 425 are connected to output interfaces 450 and 460, respectively. If, as in FIG. 4, a TX BIST has four interfaces, the corresponding RX BIST will also have four interfaces, each assigned to one of the TX BIST's interfaces.

RX BISTs 415 and 425 may also have a set of RX capture registers to store the test patterns sent by the TX BIST. For example, if two test patterns are being sent, the RX BIST may have a set of two capture registers, each capture register having space for storing at least a number of bits of data corresponding to the number of bits contained in the test patterns being sent by the TX BIST associated with that RX BIST.

The RX BISTs may be configured such that all of their registers are cleared to a default value of "0" during power up.

According to an embodiment of the present disclosure, a 3D built-in self-test scheme for 3D assembly defect detection such as the one described above using pairs of TX BIST and RX BIST modules may be engaged for both the wafer sort and FT phases of a semiconductor device fabrication process.

FIG. 5A-5D depict an example of how an embodiment of the 3D BIST scheme described in this disclosure may operate during a "wafer sort" test. Where the 3D BIST is being utilized during wafer sort testing, the objective will usually be to test the interface output, and input driver and/or buffer functionality and connectivity, and sort out the known good dies. For the wafer sort test, the TX/RX BIST may be setup to test all output/input buffers available in the interfaces of the 3D IC. In some embodiments, when the 3D BIST scheme is used in connection with wafer sort, it may be applied after the die saw step.

The TX/RX BIST may be configured to function differently for wafer sort as compared to Final Test (FT) (which may occur after 3D assembly) since they may be testing for different kinds of defects, and since the tests will usually be performed separately and independently.

As noted above, an RX BIST 415 may receive and stores value in first and second capture registers corresponding to the test patterns sent by TX BIST 410. The RX BIST 415 then analyzes the values to determine whether a defect might exist at an interface of the semiconductor device. FIGS. 5A-D provide more detail regarding processing that may occur as part of this analysis.

It will be understood that various logic operations and other operations may be performed in conducting the analysis discussed above. In the embodiments depicted in FIGS. 5 through 8, logic operations, specifically XOR and AND logic operations, are used to determine whether a defect exists based on the test pattern data. This should not be read as limiting the invention to embodiments which only use these operations however.

The main figure in FIGS. 5A-D is that of a TX BIST 510 and RX BIST 520 pair operating to detect defects in a portion 530 of a subject die as part of a wafer sort process. The elements TX BIST 510 and RX BIST 520 and portion 530 of the subject die are enlarged to focus on what occurs between and with one TX BIST and RX BIST pair, but these elements could be part of a plurality of TX BIST and RX BIST pairs.

They could correspond, for example, to the elements pictured in FIG. 4 as TX BIST 410 and RX BIST 415.

Further, the wafer sort testing process could have a plurality of pairs of TX BIST and RX BIST pairs of the kind depicted in FIG. 4 operating on a first die of a group of stacked dies that are part of a 3D IC, and others pairs of TX BIST and RX BIST pairs operating on a second die of the group of stacked dies.

The box to the right of the main figure in FIGS. 5A-D depicts particular registers and logic operations which may be implemented on an RX BIST 520 used for detecting defects. As noted above, RX BISTs may have a set of RX capture registers to store test patterns sent by their pair TX BISTs. In the embodiment depicted in FIGS. 5A-D, two test patterns are being sent. Thus RX BIST 520 has two sets of capture registers 540a and 540b, each set of capture registers has a registers corresponding to the number of bits contained in the test pattern sent by the TX BIST 510. Additionally, RX BIST 520 has a set of result registers 550 which store the output of the operation (here, a logical XOR operation) performed on the test patterns stored in the capture registers. The number of result registers 550 also corresponds to the number of bits in the test patterns. Additionally, the RX BIST 520 has a 1-bit status register 560, which stores an output of a logic AND operation performed on the bits in the results register 550.

FIG. 5 shows an example of a x-y plane interface with four output buffers and four input buffers. XTB0 TXBIST 510 and XRB0 RXBIST 520 are a launch and capture pair. As shown in the box on the right side of FIG. 5A showing the registers and logic operations, all of the RX BIST registers 540 and 550 are cleared to "0" as their default value. This may occur at power up.

Figure 5A:
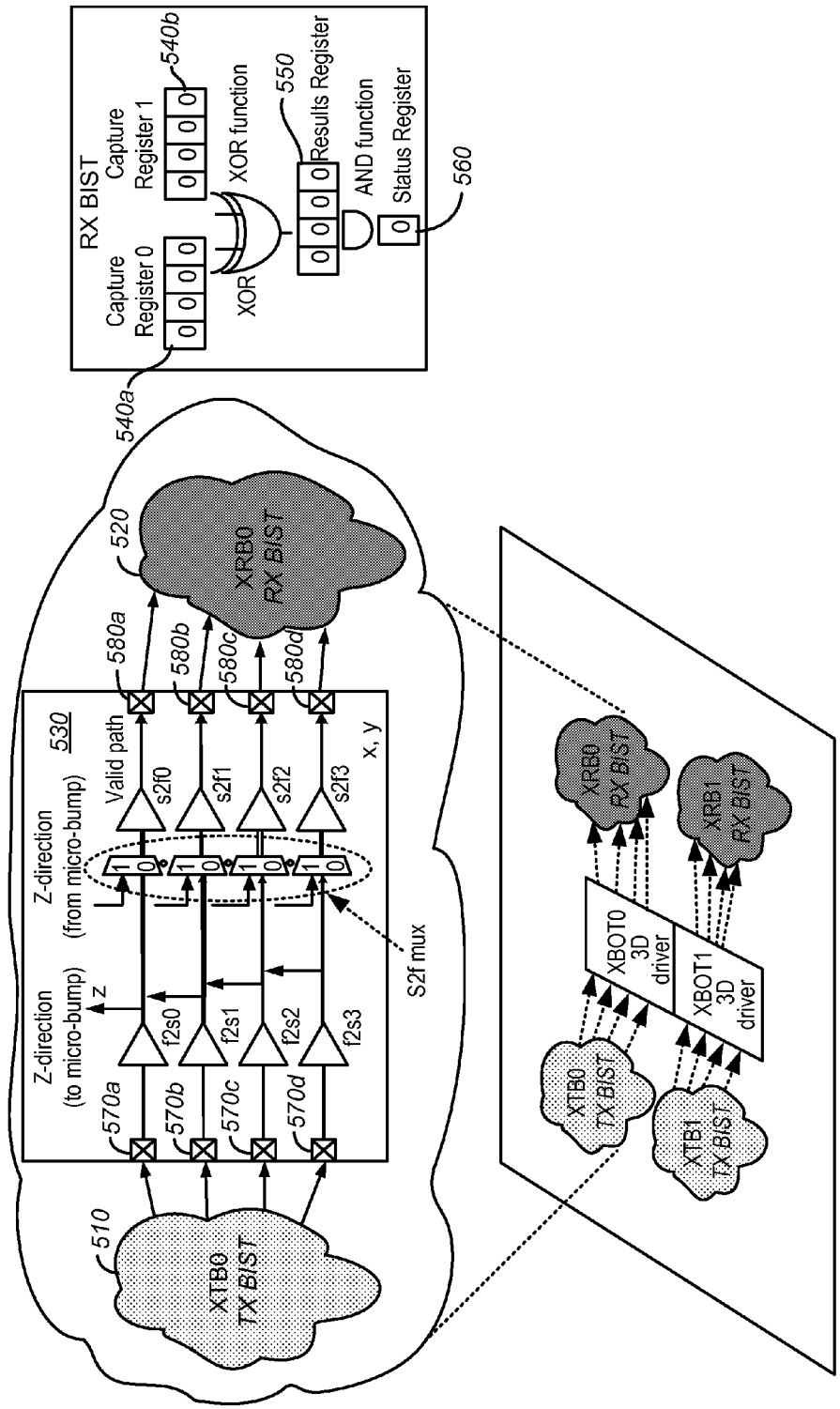
FIG. 5A is a simplified block diagram of a 3D built-in self-test scheme according to an embodiment of the present disclosure.
Figure 5B:
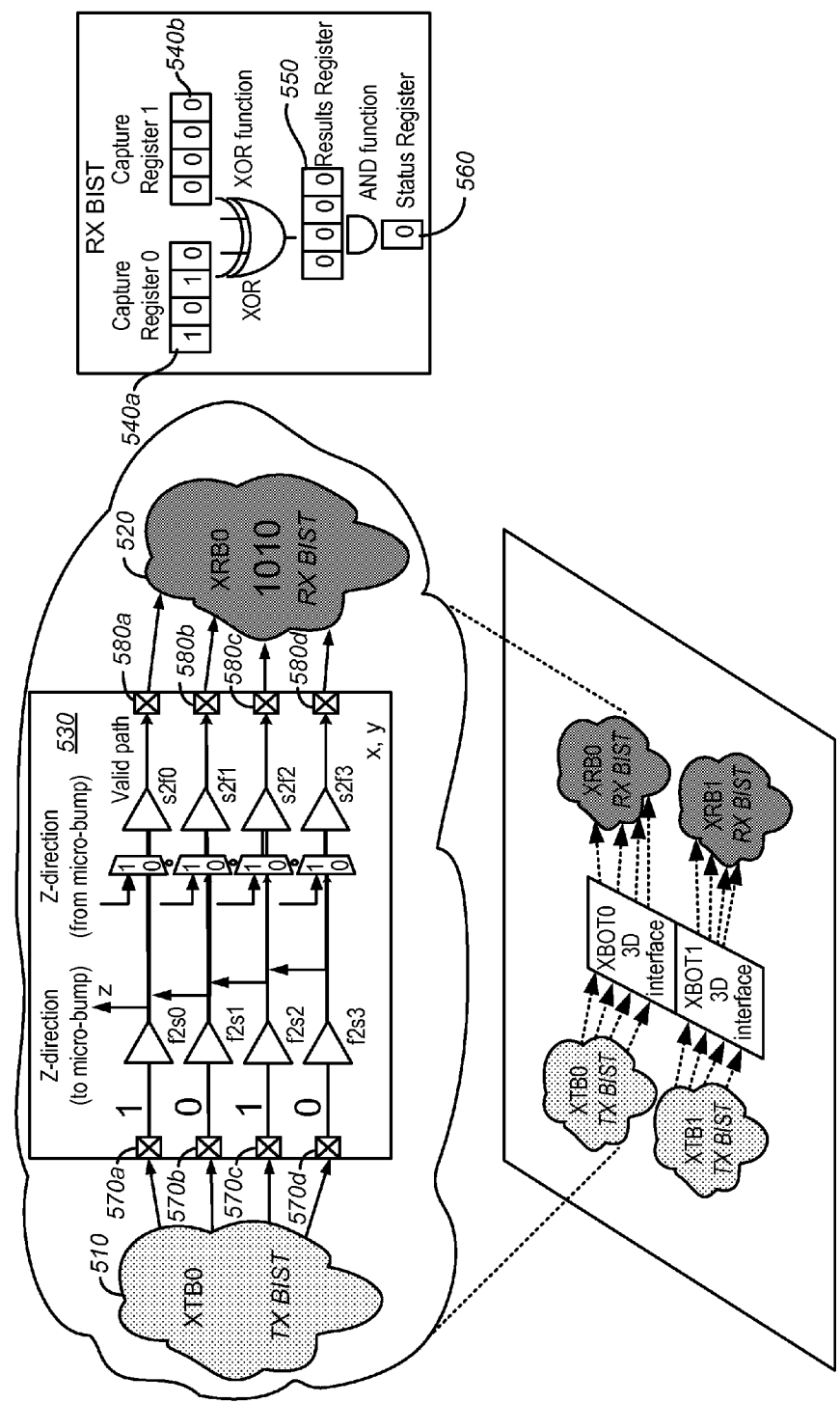
FIG. 5B is a simplified block diagram of a 3D built-in self-test scheme according to an embodiment of the present disclosure.

In FIG. 5B, TX BIST 510 launches a first pre-defined pattern—"1010" at a first test clock cycle. RX BIST 520 captures the first pattern and stores it at the first capture register 540a.

Figure 5C:
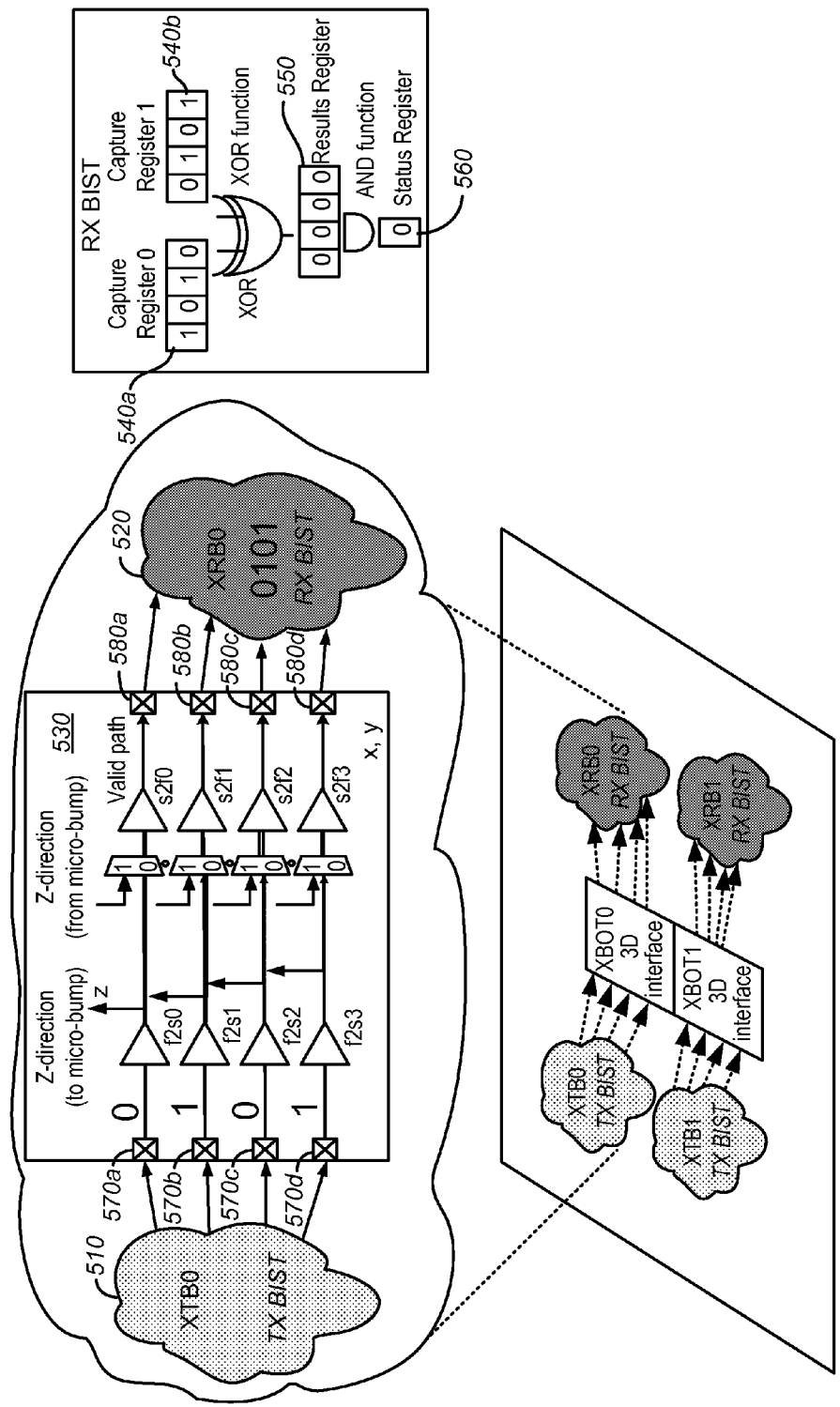
FIG. 5C is a simplified block diagram of a 3D built-in self-test scheme according to an embodiment of the present disclosure.

In FIG. 5C, TX BIST 520 launches a second pre-defined test pattern—"0101"—at a second test clock cycle. RX BIST 520 captures the first pattern and stores it at the second capture register 540b.

In FIG. 5C, RX BIST 520 processes the test patterns stored in the first and second capture registers 540. First, RX BIST 520 performs an XOR operation on pairs of values stored in the first capture register 540a and the second capture register 540b. The RX BIST 520 outputs the results of those XOR operations into results register 550. After this, RX BIST 520 proceeds to check the values stored in the results registers by performing an AND operation on the values stored there, and stores the results of that AND operation into status register 560. The status register value will thus show "1" if the results of all of the XOR operations were '1", and '0" if even one of the results was not "0". For example, in this embodiment, the appearance of all "1"'s in the results registers 550 would mean that the test was passed, and thus no defects are detected in the subject 3D interfaces. In that case, the result of the AND operation would be a "1", and a "1" would be stored in the status register To understand how the 3D BIST described in this disclosure operates, it is necessary to understand what results would obtain in the 3D BIST if there was a defect in the semiconductor die being tested. Let us assume the same TX BIST and RX BIST launch and capture pair shown in FIGS. 5A-D exist, but with the fourth (the bottom) transmission path having a defect of some kind. The defect may be located at the input interface 570d, the output interface 580d or any buffers or other portion of the path between those two interfaces. Whatever the cause, the result will be that when TX BIST 510 attempts to send a signal through that fourth transmission path, it will not reach the RX BIST 520.

Accordingly, the value stored at the fourth position of each of the capture registers 540a or 540b will always remain "0", the default value. This means that the proper values—"0", "1", "0", "1", will not be stored in the second capture register 540b as they should be (in the manner depicted in FIGS. 5A-D). Rather, the following values will be stored in the second capture register 540b: "0", "1", "0", "0". And this will lead to the result of the XOR operation being "1", "1", "1", "0", and therefore, the result of the AND operation being "0". As noted above, according to this embodiment, having a "0" in the status register indicates that a defect was discovered in the semiconductor die, and thus a user can determine the existence of a defective path on this 3D interface simply by checking the status register 560.

Figure 5D:
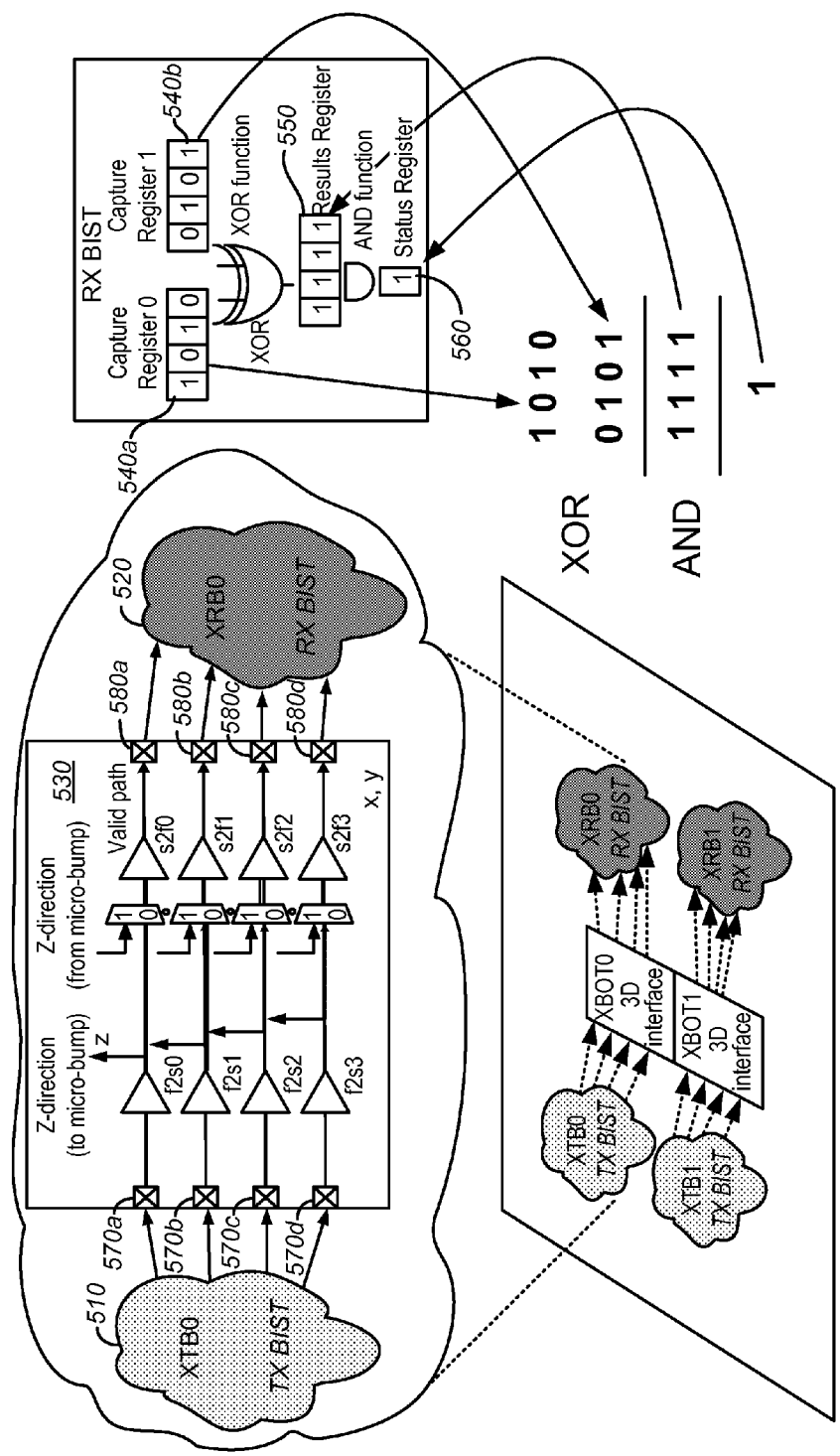
FIG. 5D is a simplified block diagram of a 3D built-in self-test scheme according to an embodiment of the present disclosure.

That is, the contents of the RX BIST's registers, as shown in the box on the right side of FIG. 5D, at the conclusion of a test on a die without any interface path defects according to an embodiment of the present application, will be different from the contents of those registers where there is a defect on one of the interface paths.

A user may scanout the status register to determine whether a defect was detected by a particular TX BIST/RX BIST pair. Then, if a defect was detected, a user may scanout the results register to find out which of the paths tested by a TX BIST and RX BIST pair was defective. This process is discussed further below in connection with FIG. 7.

Now turning to how the 3D BIST scheme described in this disclosure would work in the context of a Final Test (FT) process, FIG. 6 depicts an example of the disclosed 3D BIST scheme comprising at least one pair of TX BIST and RX BIST modules operating in the context of a FT process.

Where the 3D BIST scheme is run in the context of FT, the goals may be different from those which apply in the context of wafer sort testing. For example, for FT testing, the goals may be to identify potential failure relating to connecting together different die layers. Such failures may include defective micro-bumps, or any other assembly defect that causes the breakdown of connectivity. The primary purpose may be to detect and test vertical connectivity, that is, connectivity between a top and a bottom die, for example, where different die layers are being connected vertically.

As with the testing happening during the wafer sort process, there are TX BIST and RX BIST launch and capture pairs, and similar processing of received test patterns at the RX BIST to determine whether there is a defect in a 3D IC's interfaces.

However, in contrast with the wafer sort testing depicted above in FIGS. 4 and 5, which occurs on an x-y plane where a single die layer is being tested, the testing occurring in FT may relate to interconnects in the z direction—that is, vertical interconnects which are linking a top die and a bottom die, for example.

As shown in FIG. 6, the TX module 610 sends signals into the bottom die 615 which transmits those signals in the z direction upward to the top die 625. The signals are transmitted between the two dies using micro-bumps. Both the top and bottom die is shown as having two sets of vertical interfaces (which may act as both input and output interfaces). Where the direction in which signals are being sent is from the bottom die to the top die, the following interface paths may exist:

XBOT0.out0→ubump.B→XTOP0.in0
XBOT0.out1→ubump.A→XTOP0.in1
XBOT0.out2→ubump.D→XTOP0.in2
XBOT0.out3→ubump.C→XTOP0.in3 and

XBOT1.out0→ubump.F→XTOP1.in0
XBOT1.out1→ubump.E→XTOP1.in1
XBOT1.out2→ubump.H→XTOP1.in2
XBOT1.out3→ubump.G→XTOP1.in3

Focusing for purposes of clarity on the first set of interfaces listed above, the XTBO TX BIST 610 (launch) and the XRBO RX BIST 620 (capture) modules associated with that first set of interfaces may be pre-defined and matched according to 3D interface signal mapping.

In a particular embodiment, TX BIST 610 may launch a first pre-defined test pattern during a first clock cycle, and a second pre-defined test pattern during a second clock cycle, and RX BIST 620 may capture these test patterns as inputs during these two clock cycles. Both the top and the bottom die may use a common test clock. All RX BIST registers may be cleared to "0" after power up.

Figure 6A:
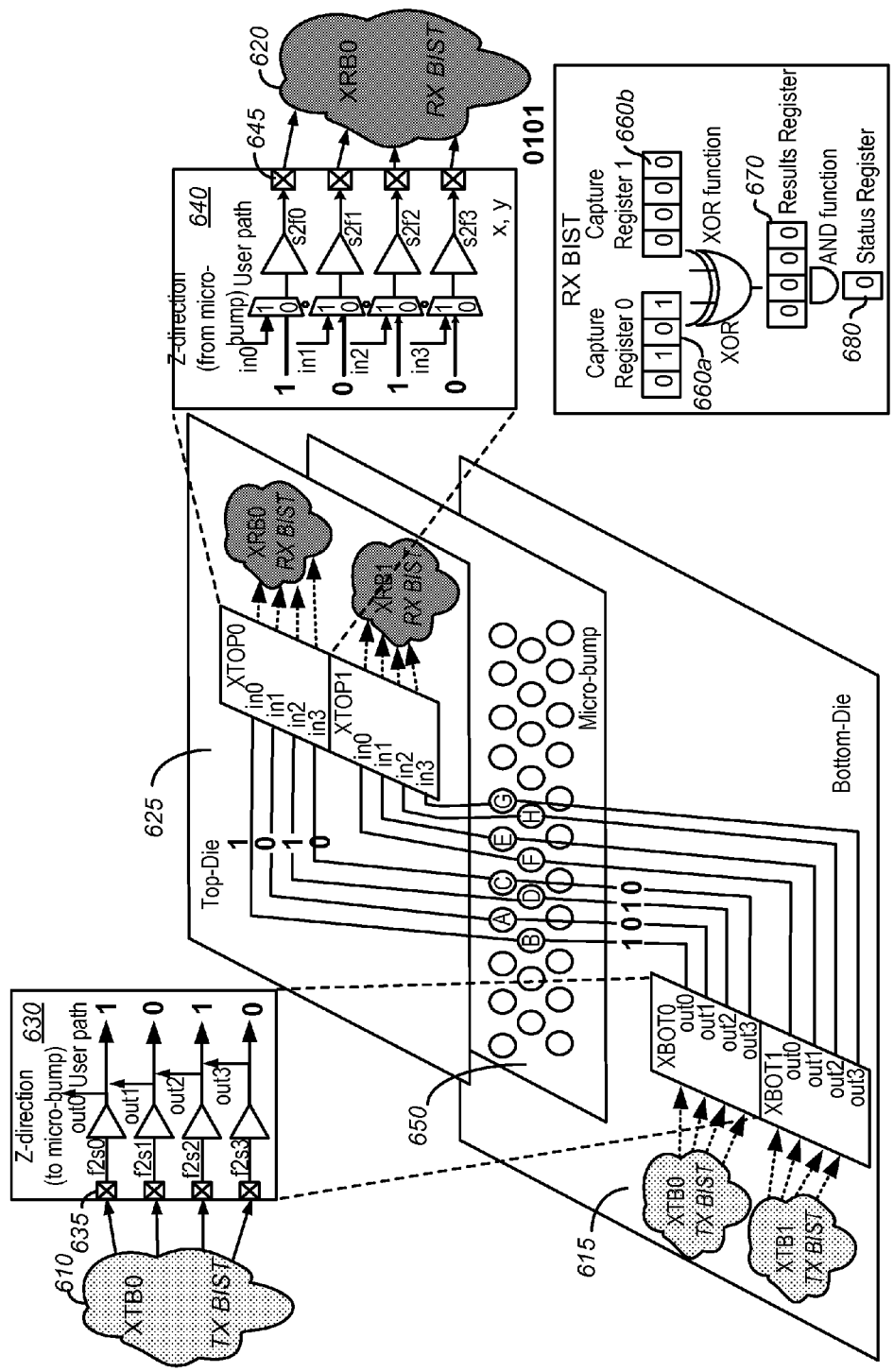
FIG. 6A is a simplified block diagram of a 3D built-in self-test scheme according to an embodiment of the present disclosure.

As shown in FIG. 6A, TX BIST 610 launches a first pre-defined test pattern—"1010" at a first test clock cycle. RX BIST 620 captures the first pattern and stores it at the first capture register 640*a*.

Figure 6B:
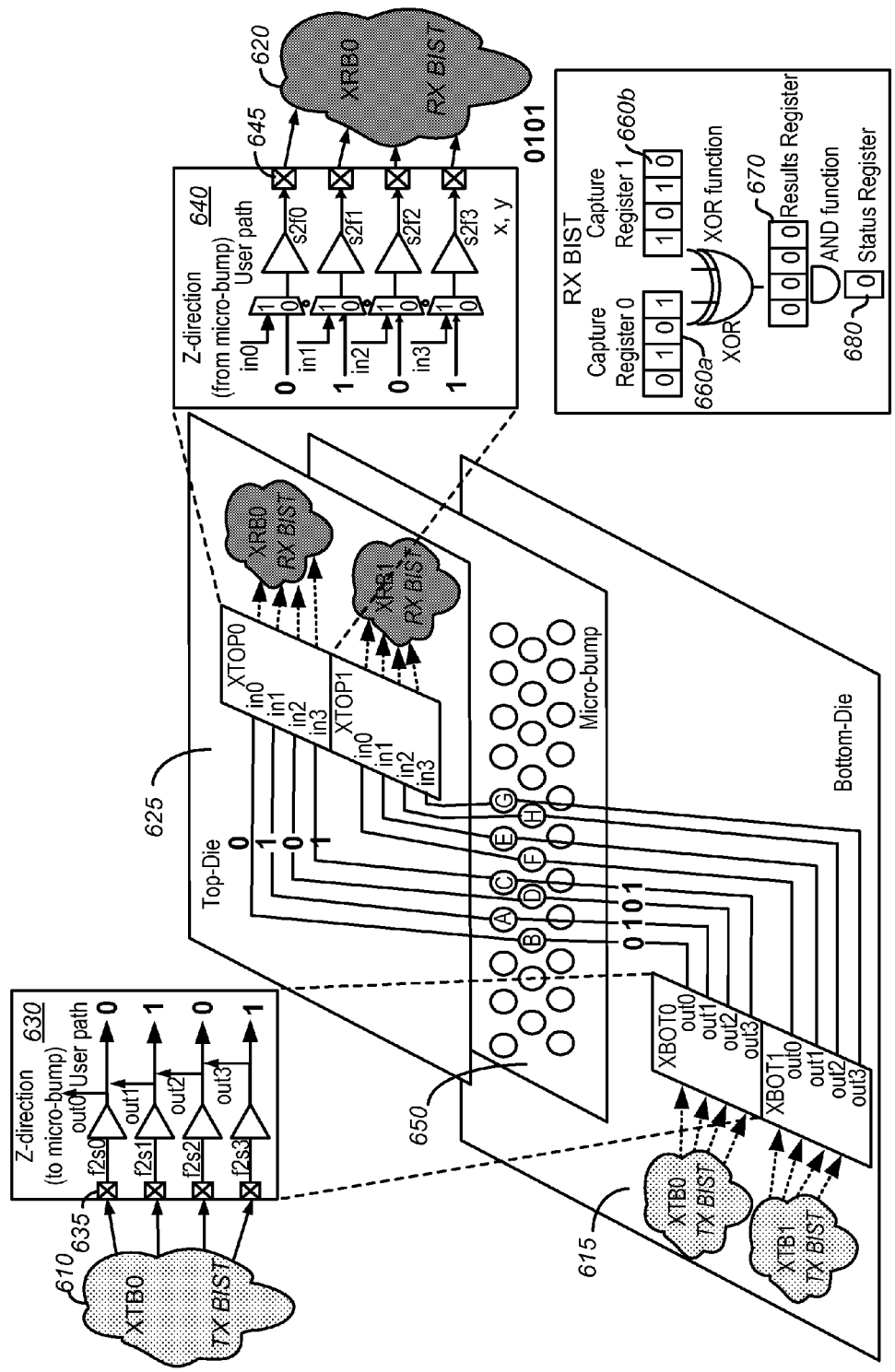
FIG. 6B is a simplified block diagram of a 3D built-in self-test scheme according to an embodiment of the present disclosure.

In FIG. 6B, TX BIST 620 launches a second pre-defined test pattern—"0101"—at a second test clock cycle. RX BIST 620 captures the first pattern and stores it at the second capture register 640*b*.

Figure 6C:
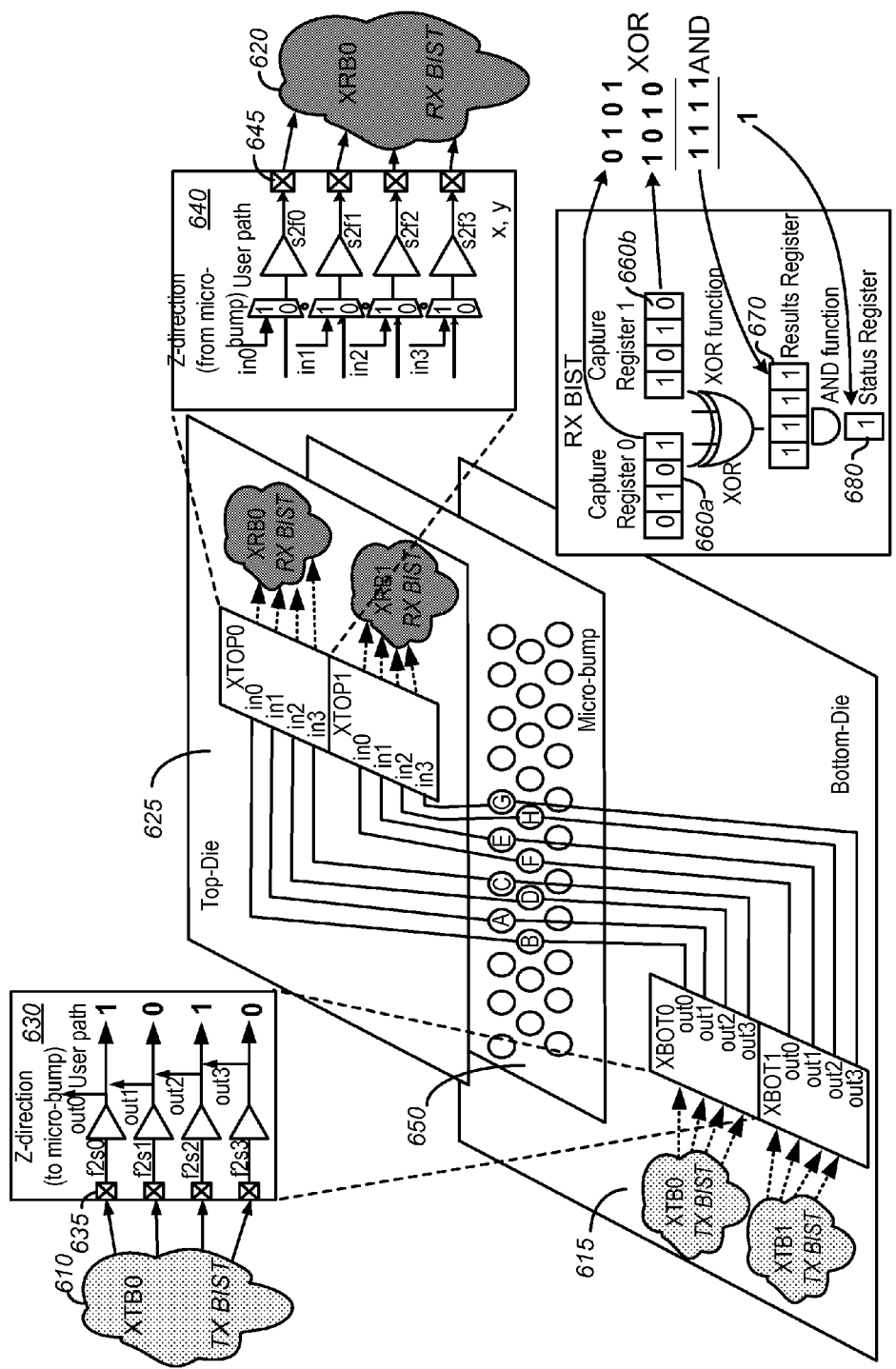
FIG. 6C is a simplified block diagram of a 3D built-in self-test scheme according to an embodiment of the present disclosure.

In FIG. 6C, RX BIST 620 processes the test patterns stored in the first and second capture registers 640. First, RX BIST 620 performs a logical XOR operation to check the values stored in the first capture register 660*a* and the second capture register 660*b*. The results are output into results register 670. After this, RX BIST 620 proceeds to check the values stored in the results register 670 by performing a logical AND operation on the values stored there, and stores the results of that AND operation into status register 680. For example, in a particular embodiment, the appearance of all "1"s in the results registers 670 would mean that the test was passed on a particular Z-direction connectivity check, for example, that no defective bump or broken paths exist in the set of interfaces being tested. In that was the case, the result of the AND operation would be a "1", and a "1" would be stored in the status register Now, let us assume there is a defect in micro-bump C of the set of micro-bumps 650 connecting the top die 640 to the bottom die 630. Micro-bump C is connected to the fourth transmission path between the XTBO 610 and RXBO 620 launch and capture pair. Whatever the cause of the defective transmission path, the result will be that when TX BIST 610 attempts to send a signal through that path, it will not reach RX BIST 620.

When such a defect exists, the value at the fourth position of each of the capture registers 660*a* or 660*b* will always remain "0". This means that the proper values—"0", "1", "0", "1", will not be stored in the second capture register 640*b* as they were in FIGS. 6A-C. Rather, the following values will be stored: "0", "1", "0", "0" where the C micro-bump, which is associated with the fourth transmission path, is defective. This will lead to the result of the XOR operation being "1", "1", "1", "0" (these values will be stored in the results register), and the result of the AND operation being "0" (this value will be stored in the status register).

The indication of "0" in the status register indicates to a user that the set of micro-bumps tested by this TX BIST and RX BIST pair has a defect. In other words, a, "0" in the status register mean the subject die failed the test, and there are defective paths on this 3D interface. This may lead a user to scanout the results register to find out which path is defective and possibly engage the Z-direction redundancy path solution on that path, for example.

Figure 7:
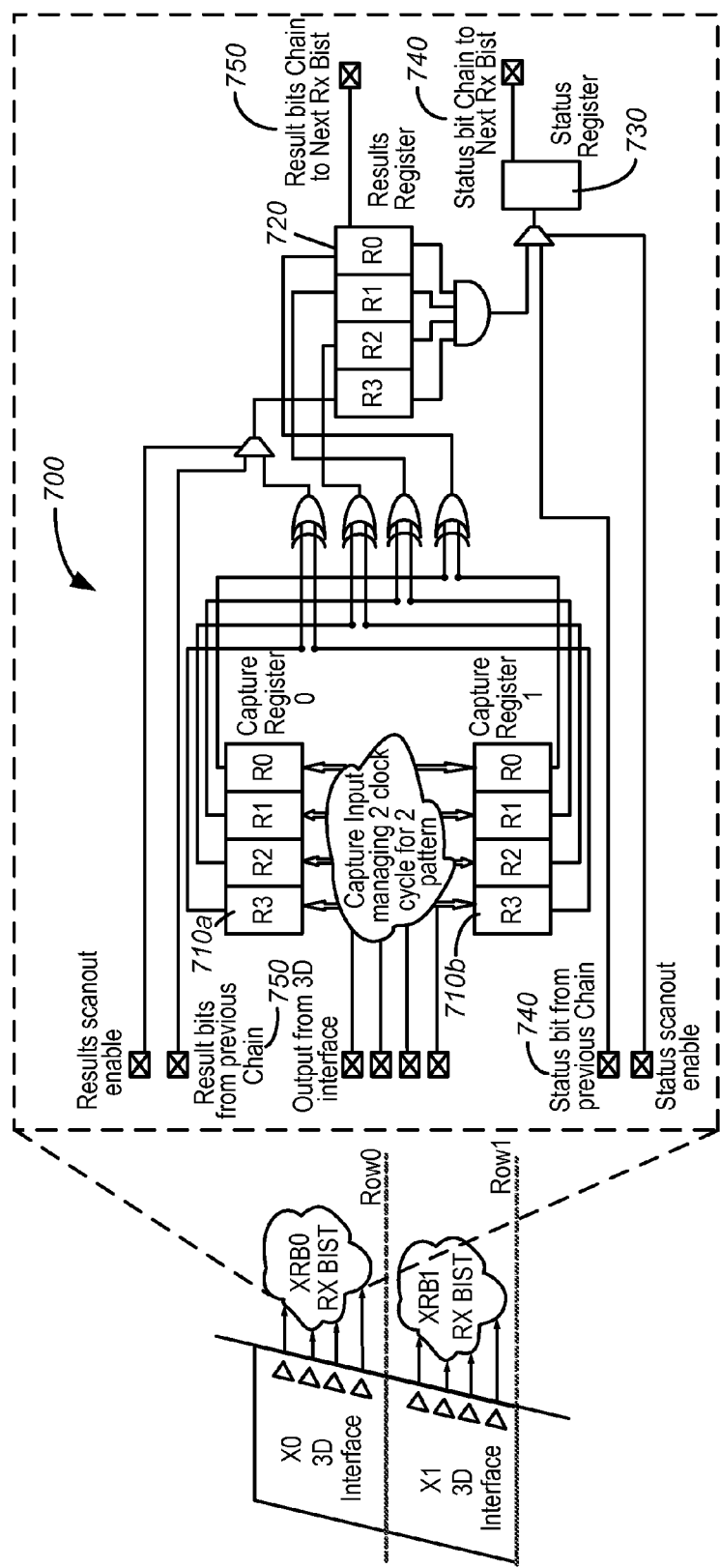
FIG. 7 is a simplified block diagram of a 3D built-in self-test scheme according to an embodiment of the present disclosure.

FIG. 7 shows how a user may scanout the results register to find out which of the four paths tested by a TX BIST and RX BIST pair is defective. FIG. 7 shows two capture registers 710*a* and 710*b*. An XOR operation is performed on the values stored in the capture registers and the results are output to a results register 720. An AND operation is then performed on the values stored in the results register 720, and the result is stored in a status register 730.

While the above discussion has focused on the operation of one TX BIST and RX BIST pair, in operation, it is likely that there will be a large number of such TX BIST and RX BIST pairs, each working in parallel to check for defects at a large number of interfaces of one die layer or multiple die layers. In order to determine where a defect is located, in one embodiment of the present disclosure, the RX BIST modules are communicatively linked together, as shown in FIG. 7. In particular, in various embodiments, two independent "register chains" are sent down a series of RX modules. First, there is a Status Register Chain 740 that comprises all the status register result bits from each of the RX modules in a chain including those in RX BIST 700. This is the primary register chain to be used in scanout during either a wafer sort testing process or an FT testing process. Status Register Chain 740 may be used to determine whether all interfaces passed a test, or not. Where there was a defect in one of the interfaces, the second chain, which can be referred to as the Results Register Chain 750 may be used. It may be scanned out if any failure is detected from the Status Register Chain 740. It is used for debugging and identifying the particular location of a failure.

Figure 8A:
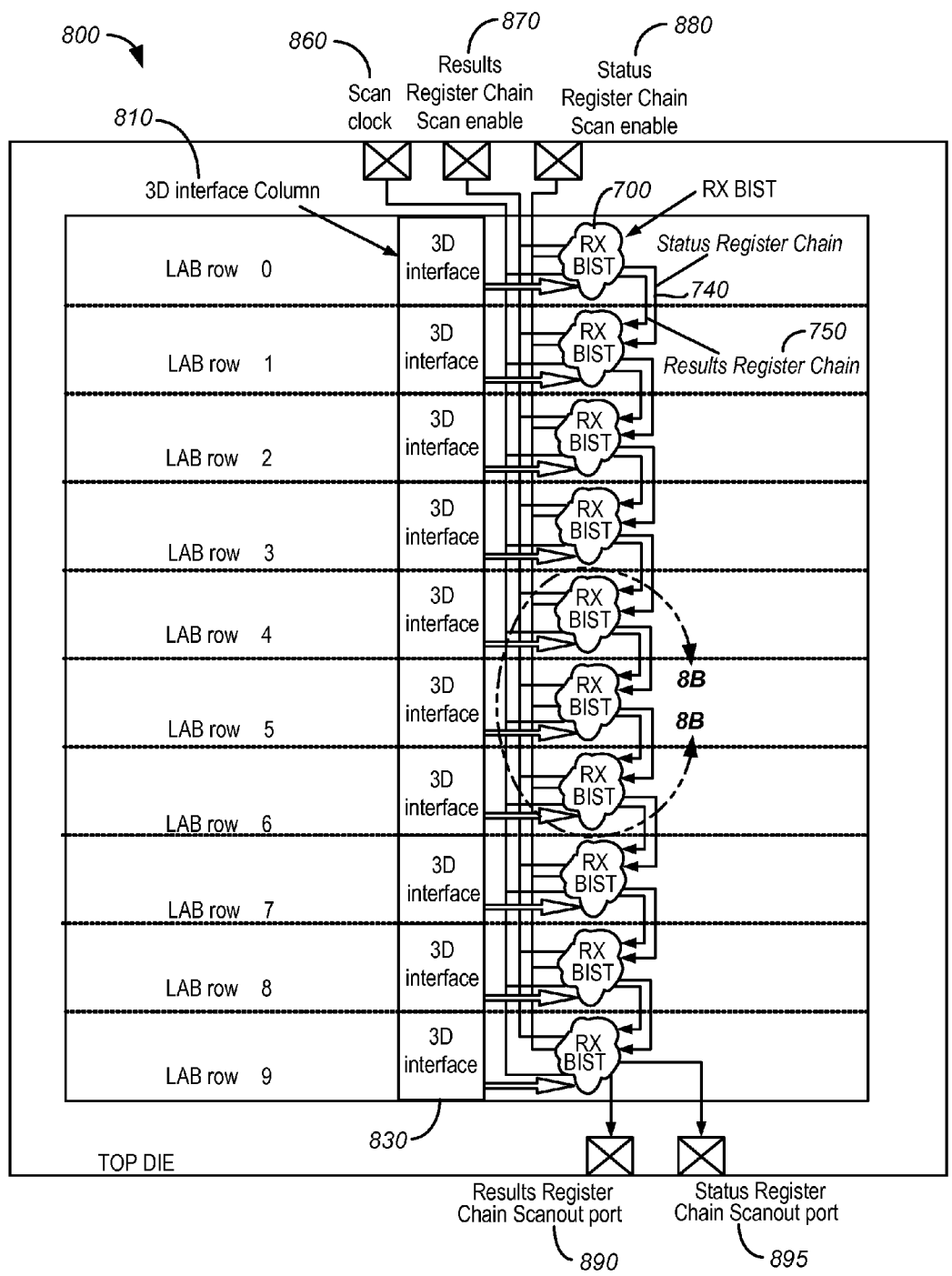
FIG. 8A is a simplified block diagram of a 3D built-in self-test scheme according to an embodiment of the present disclosure.
Figure 8B:
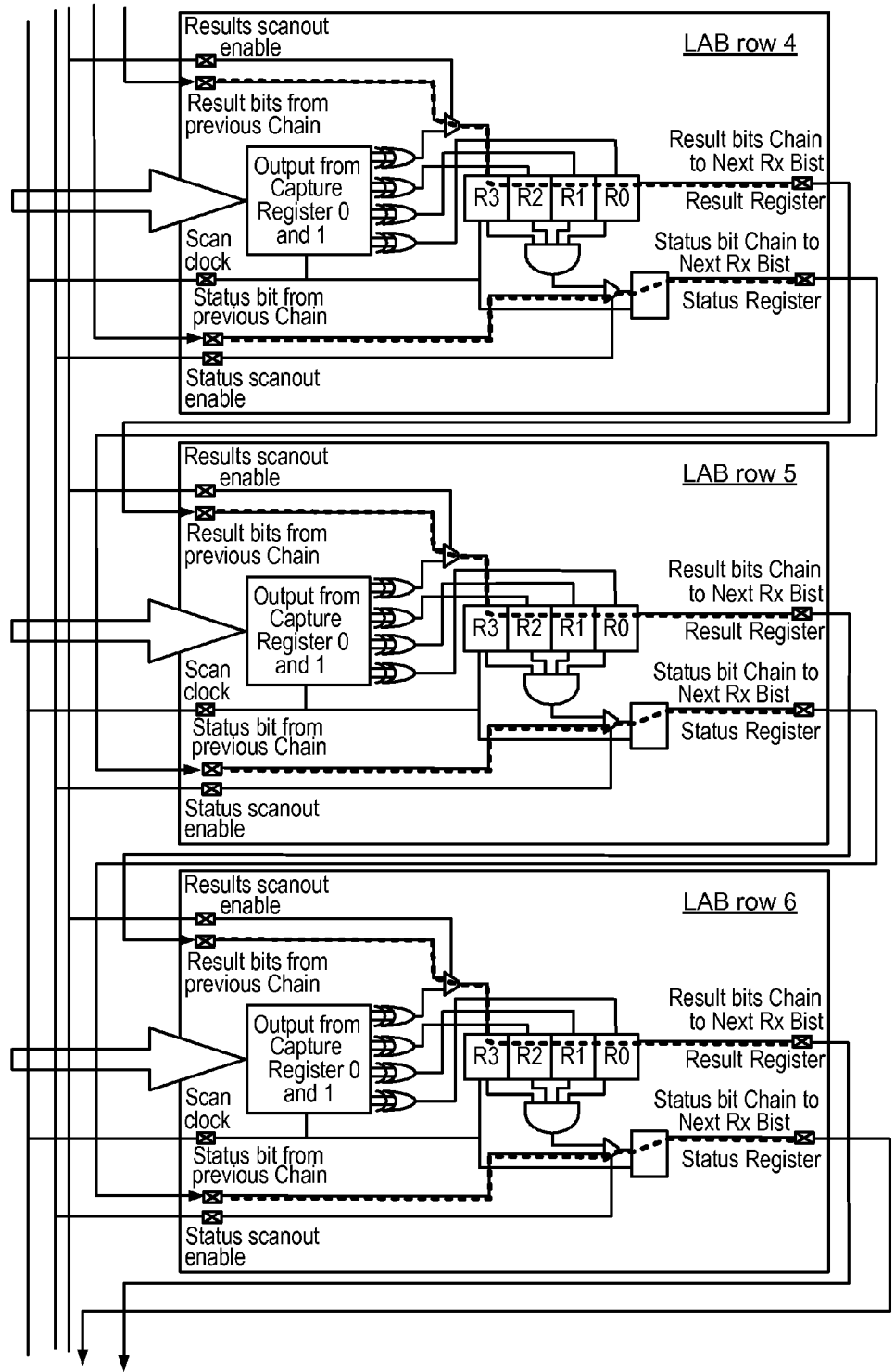
FIG. 8B is a simplified block diagram of a portion of a 3D built-in self-test scheme according to an embodiment of the present disclosure.

FIG. 8A shows an example of use of the 3D BIST testing scheme in the context of a Field Programmable Gate Array (FPGA) 800 with a plurality of Logic Array Block (LAB) rows 810. FIG. 8 shows a plurality of RX BISTs 700 built into the FPGA 800, each associated with one of the LAB rows 810, and each connected to their associated LAB row through an interface 830. Each RX BIST 700 is also connected in sequence to a next RX BIST. Using the communication link between the RX BISTs, a Status Register Chain 740 and a Results Register Chain 750 may be scanned out through the Status Register Chain Scanout port 895 and the Results Register Scanout Port 890, respectively. One scan clock 860 is used for both the Status Register Chain 740 and the Results Register Chain 750. Further, there are two different scan enables built into the FPGA, each connected to an input/output (IO) interface: a Status Register scanout enable 880 and a Results Register scanout enable 870. FIG. 8B shows a zoomed in view of a portion of FIG. 8A, specifically a zoomed in view of three of the RX BISTs, and the connections between them, that are depicted in FIG. 8A.

While the disclosure has been particularly shown and described with reference to specific embodiments thereof, it will be understood by those skilled in the art that changes in the form and details of the disclosed embodiments may be made without departing from the spirit or scope of the disclosure. For example, embodiments of the present disclosure may be employed with a variety of network protocols and architectures. It is therefore intended that the disclosure be interpreted to include all variations and equivalents that fall within the true spirit and scope of the present disclosure.

What is claimed is:

1. A method for determining the existence of defects in a semiconductor device by using a 3D-Assembly Built in Self-Test (BIST) scheme comprising at least one transmitting (TX) BIST module and at least one receiving (RX) BIST module, the method comprising:
    launching at a first TX BIST module a first test pattern into the semiconductor device at a first test clock cycle;
    capturing at a first RX BIST module the first test pattern after the first test pattern has passed through a portion of the semiconductor device being tested for defects;
    storing the captured first test pattern at a first memory location;
    launching at the first TX BIST module a second test pattern into the semiconductor device at a second test clock cycle;
    capturing at the first RX BIST module the second test pattern after the second test pattern has passed through the portion of the semiconductor device being tested for defects;
    storing the captured second test pattern at a second memory location;
    analyzing values stored in the first and second memory locations to determine whether a defect exists in the semiconductor device.

2. The method of claim 1, wherein a number of bits in the first and second test patterns corresponds to a number of interfaces being tested for defects.

3. The method of claim 1, wherein the analyzing comprises the RX BIST module performing a first logic operation with values in the first test pattern and the second test pattern, and outputting the results of the first logic operation into a results register.

4. The method of claim 3, wherein the analyzing further comprises performing a second logic operation on values stored in the results register to output a status result that indicates a possibility of a defect existing in the semiconductor device, and the method further comprises, storing the status result in a status register.

5. The method of claim 3, wherein a plurality of TXBIST module and RXBIST module pairs, including the first TXBIST module and first RXBIST module, are configured to test for defects on a plurality of different portions of a semiconductor device and wherein the RXBIST modules are communicatively coupled to one another; and
    the first RXBIST module is further configured to:
    receive a previous results bits chain from a second RXBIST module;
    combine results bits from the previous results bits chain with bits stored in the results register to form a new results bits chain; and
    transmit the new results bit chain to a third RXBIST module.

6. The method of claim 5, wherein a final results bits chain is output by a last of the RXBIST modules of the plurality of RXBIST modules after the last RXBIST module has added its own results bits to the previous results bits chain; and
    wherein the final results bits chain can be used to identify not only the existence but also the approximate location of detected defects in a semiconductor device.

7. The method of claim 1, wherein the 3D-Assembly BIST is implemented in hardware, software or a combination of hardware and software.

8. The method of claim 1, wherein the process is operable to function to detect defects during one or both of a wafer sort phase and a final testing phase of a semiconductor fabrication process.

9. An apparatus that uses a 3D-Assembly Built in Self-Test (BIST) scheme for determining the existence of defects in a semiconductor device, the apparatus comprising:
    a first transmitting (TX) BIST module configured to launch a predefined first test pattern into the semiconductor device and a predefined second test pattern into the semiconductor device; and
    a first receiving (RX) BIST module configured to capture the first and second predefined test patterns launched by the TX BIST module after the test patterns have passed through a portion of the semiconductor device being tested for defects, and store the captured first and second test patterns in respective first and second memory locations;
    process the captured test patterns to determine whether any defects exist in the semiconductor device; and
    report results of the processing.

10. The apparatus of claim 9, wherein the apparatus is configurable to function to detect defects during one or both of a wafer sort phase and Final Test (FT) phase of a semiconductor fabrication process.

11. The apparatus of claim 9, wherein the processing comprises the RX BIST module performing a first logic operation with values in the first test pattern and the second test pattern, and wherein a number of bits in each of the first and second test patterns corresponds to a number of interfaces being tested for defects.

12. The apparatus of claim 11, wherein the first memory location and the second memory location are capture registers, and the processing further comprises outputting the results of the first logic operation into a results register.

13. The apparatus of claim 12, wherein the processing further comprises:
    performing a second logic operation on values stored in the results register to output a status result that indicates a possibility of a defect existing in the semiconductor device, and
    storing the status result in a status register.

14. The apparatus of claim 12, wherein a plurality of TXBIST module and RXBIST module pairs, including the first TXBIST module and the first RXBIST module, are configured to test for defects on a plurality of different portions of a semiconductor device and wherein the RXBIST modules are communicatively coupled to one another; and
    wherein the first RX BIST module is further configured to receive a previous results bits chain from a second RXBIST module;
    combine results bits from the previous results bits chain with bits stored in the first results register to form a new results bits chain; and
    transmit the new results bit chain to a third RXBIST module.

15. The apparatus of claim 14, wherein a final results bits chain is output by a last of the RXBIST module of the plurality of RXBISTs after the last RXBIST module has added its own results bits to the previous results bits chain; and wherein the final results bits chain can be used to identify approximate locations of detected defects in the semiconductor device.

16. The apparatus of claim 9, wherein the apparatus includes hardware, software or a combination of hardware and software.

17. At least one computer readable non-transitory storage medium having computer program instructions stored thereon for determining the existence of defects in a semiconductor device by using a 3D-Assembly Built in Self-Test (BIST) scheme, the computer program instructions arranged to perform the following operations:
    launch at a first TX BIST module a first test pattern into the semiconductor device at a first test clock cycle;

capture at a first RX BIST module the first test pattern after the first test pattern has passed through a portion of the semiconductor device being tested for defects;

store the captured first test pattern at a first memory location;

launch at the first TX BIST module a second test pattern into the semiconductor device at a second test clock cycle;

capture at a second RX BIST module the second test pattern after the second test pattern has passed through the portion of the semiconductor device being tested for defects;

store the captured second test pattern at a second memory location;

analyze values stored in the first and second memory locations to determine whether a defect exists in the semiconductor device.

\* \* \* \* \*